United States Patent
Tanaka

Patent Number: 6,133,801
Date of Patent: *Oct. 17, 2000

[54] CRYSTAL OSCILLATION CIRCUIT

[75] Inventor: Shoichi Tanaka, Shizuoka, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/842,206

[22] Filed: Apr. 23, 1997

[30] Foreign Application Priority Data

Apr. 23, 1996 [JP] Japan .................. 8-101161

[51] Int. Cl.⁷ .................. H03B 5/36; H03L 3/00
[52] U.S. Cl. .................. 331/158; 331/116 R; 331/175; 331/160; 331/183
[58] Field of Search .................. 331/158, 160, 331/175, 183

[56] References Cited

U.S. PATENT DOCUMENTS 4,896,122  1/1990  Tahernia et al. .................. 331/158

FOREIGN PATENT DOCUMENTS

| 0 593 069 A2 | 4/1994 | European Pat. Off. . |
|---|---|---|
| 61-69205 | 4/1986 | Japan . |
| 61-287303 | 12/1986 | Japan . |
| 63-219208 | 9/1988 | Japan . |
| 63-187412 | 11/1988 | Japan . |
| 2-122705 | 5/1990 | Japan . |
| 2-134721 | 11/1990 | Japan . |
| 2-274103 | 11/1990 | Japan . |
| 4-135302 | 5/1992 | Japan . |
| 4-165704 | 6/1992 | Japan . |
| 5-501181 | 3/1993 | Japan . |
| 5-218740 | 8/1993 | Japan . |
| 6-53741 | 2/1994 | Japan . |
| 6-77317 | 10/1994 | Japan . |
| 2 201 853 | 9/1988 | United Kingdom . |

*Primary Examiner*—Arnold Kinkead
*Attorney, Agent, or Firm*—Scully, Scott Murphy & Presser

[57] ABSTRACT

A crystal oscillation circuit includes a main oscillation circuit, an auxiliary oscillation circuit, and a control circuit. The main oscillation circuit has a crystal resonator. The auxiliary oscillation circuit increases an exciting current of the crystal resonator to assist the start of oscillation of the main oscillation circuit. The control circuit connects the auxiliary oscillation circuit parallel to the main oscillation circuit at the start of oscillation to increase an exciting current of the crystal resonator.

16 Claims, 8 Drawing Sheets

FIG. 5A OSCILLATION CONTROL SIGNAL 108

FIG. 5B OSCILLATION OUTPUT 109

FIG. 5C START SIGNAL 106

CRYSTAL OSCILLATION CIRCUIT

BACKGROUND OF THE INVENTION

The present invention relates to a crystal oscillation circuit and, more particularly, to a crystal oscillation circuit which can start oscillating even with a crystal resonator having a high impedance in a low-exciting-level range.

As crystal oscillation circuits, a Colpitts oscillation circuit using a transistor and a Hartley oscillation circuit are generally known. Recently, a crystal oscillation circuit using the gate element of an integrated circuit is being frequently used.

FIG. 7 shows a conventional crystal oscillation circuit using a transistor, which is a Colpitts crystal oscillation circuit having a crystal resonator 3 and a transistor 31.

FIG. 8 shows a conventional crystal oscillation circuit using a gate element. This oscillation circuit is oscillated using a crystal resonator 3 and an inverter 34 serving as an IC gate element.

FIG. 9 shows the impedance characteristics of a crystal resonator. In general, the crystal resonator exhibits flat impedance characteristics with respect to an exciting level. However, some crystal resonators have large variations in impedance upon changes in exciting level, resulting in defectives. It is understood from a broken line shown in FIG. 9 that there is a range wherein the impedance abruptly increases at a low exciting level.

If the crystal resonator 3 having a high impedance at a low exciting level is used in the crystal oscillation circuit shown in FIG. 7 or 8, oscillation cannot be started. An example of a crystal oscillation circuit capable of starting oscillation with a crystal resonator having a high impedance at a low exciting level is a "CRYSTAL OSCILLATION CIRCUIT" in Japanese Patent Laid-Open No. 61-287303.

FIG. 10 shows a conventional crystal oscillation circuit which starts with a crystal resonator having a high impedance at a low exciting level. This circuit is obtained by adding a circuit constituted by a transistor 32, a resistor 33, and a Zener diode 35 to the crystal oscillation circuit having the crystal resonator 3 and the transistor 31 shown in FIG. 7. In this crystal oscillation circuit, if a power voltage (+Vcc) does not rise to the Zener voltage of the Zener diode 35 or higher upon turning on the power supply, the transistor 32 remains nonconductive, and no base bias voltage is applied to the transistor 31 not to oscillate the circuit. For this reason, the crystal oscillation circuit is not affected by the leading time of the power voltage. If the power voltage (+Vcc) exceeds the Zener voltage, the transistor 32 is rendered conductive, and the base bias voltage is abruptly applied to the transistor 31. Accordingly, a large exciting energy is given to the crystal resonator 3 to improve the start performance of the oscillation circuit. Therefore, this crystal oscillation circuit can start oscillating even with a crystal resonator having a high impedance at a low exciting level.

The conventional crystal oscillation circuit shown in FIG. 10 uses the transistor 32 and the Zener diode 35. For a logic circuit constituted by a logic IC and an IC incorporating an oscillation circuit, the use of this crystal oscillation circuit increases the number of types of semiconductor elements, resulting in a complicated circuit configuration and low economy.

SUMMARY OF THE INVENTION

It is an object of the present invention to provide a crystal oscillation circuit which is constituted by a gate element and can start oscillating even with a crystal resonator having a high impedance at a low exciting level.

In order to achieve the above object, according to the present invention, there is provided a crystal oscillation circuit comprising main oscillation means having a crystal resonator, auxiliary oscillation means for increasing an exciting current of the crystal resonator to assist a start of oscillation of the main oscillation means, and control means for connecting the auxiliary oscillation means parallel to the main oscillation means at the start of oscillation to increase an exciting current of the crystal resonator.

DESCRIPTION OF THE PREFERRED EMBODIMENTS

The present invention will be described below with reference to the accompanying drawings.

Figure 1:
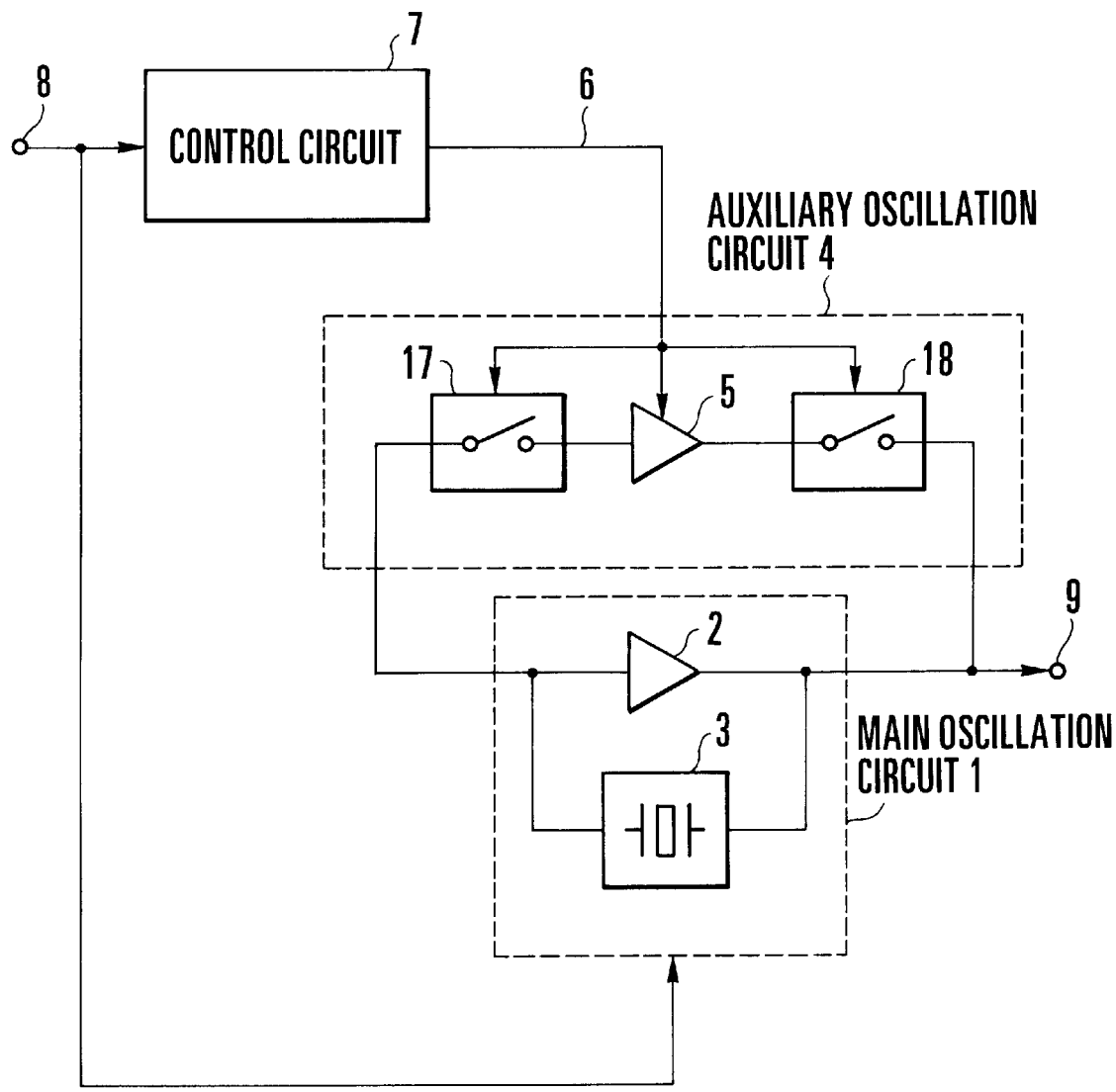
FIG. 1 is a block diagram showing a crystal oscillation circuit according to the first embodiment of the present invention.

FIG. 1 shows a crystal oscillation circuit according to the first embodiment of the present invention. The crystal oscillation circuit of this embodiment comprises a main oscillation circuit 1 which outputs an oscillation signal 9 upon crystal oscillation, an auxiliary oscillation circuit 4 which is connected parallel to the main oscillation circuit 1 to assist excitation of the main oscillation circuit 1, and a control circuit 7 which controls the operation of the auxiliary oscillation circuit 4 in response to an externally input oscillation control signal 8. The main oscillation circuit 1 has a crystal resonator 3 which performs an oscillation operation, and a buffer element 2 which is connected parallel to the crystal resonator 3 to increase an exciting current of the crystal resonator 3. The auxiliary oscillation circuit 4 comprises analog switches 17 and 18 which are operated by a start signal 6 output from the control circuit 7, and a feedback amplification buffer element 5.

Figure 2:
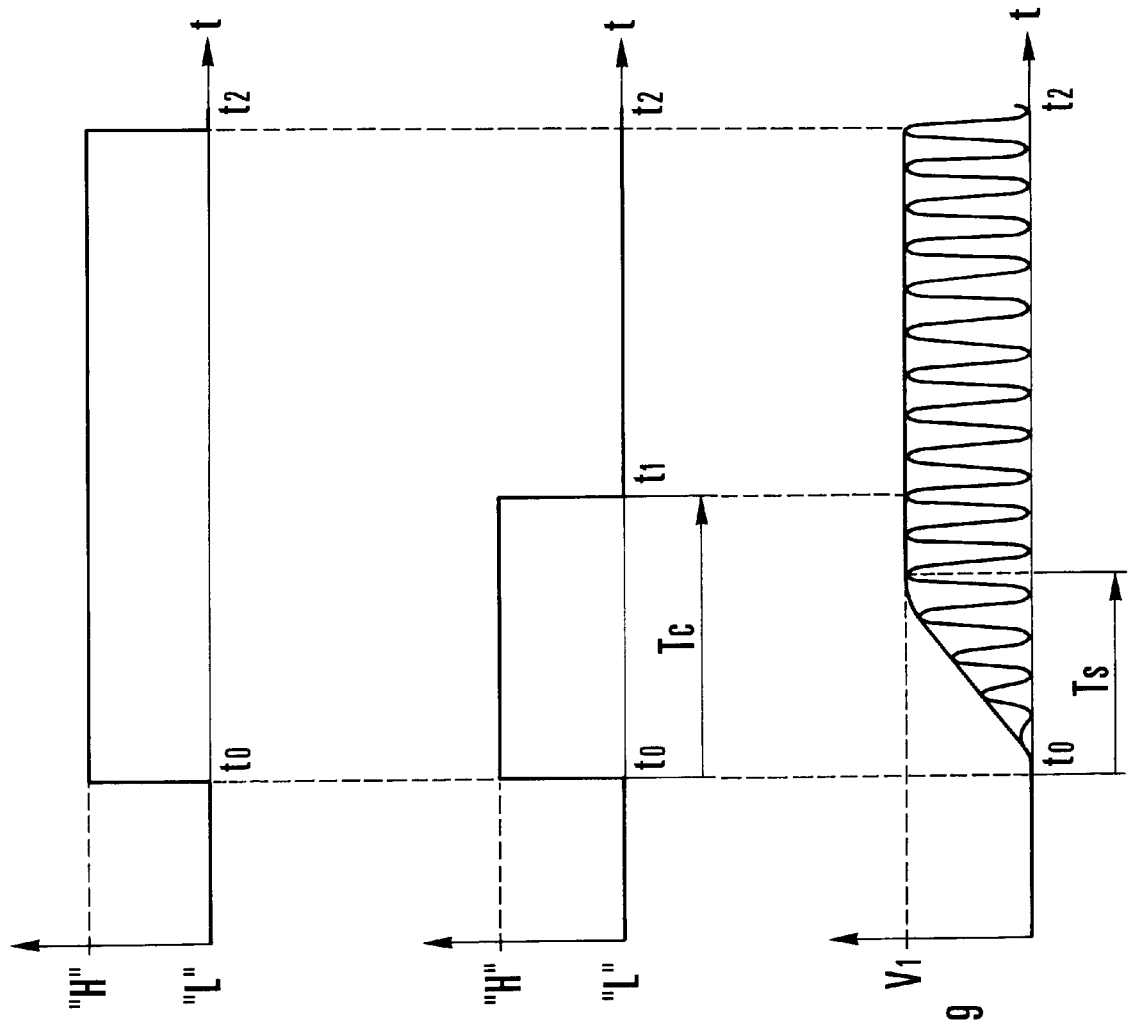
FIGS. 2A to 2C are timing charts showing the operation of the crystal oscillation circuit shown in FIG. 1.

The operation of the crystal oscillation circuit shown in FIG. 1 will be explained with reference to timing charts shown in FIGS. 2A to 2C. At the start of the oscillation circuit, the level of the oscillation control signal 8 is changed from Low level (to be referred to as "L" hereinafter) to High level (to be referred to as "H" hereinafter) at time to, as shown in FIG. 2A. In synchronism with the leading of the input oscillation control signal 8, the control circuit 7 changes the level of the start signal 6 from "L" to "H", as shown in FIG. 2B. After the level of the start signal 6 is held at "H" for a predetermined period of time, it is changed from "H" to "L" at time $t_1$. With this operation, the start signal 6 having a pulse width Tc is output to the auxiliary oscillation circuit 4.

In the auxiliary oscillation circuit 4, the buffer element 5 is set in an operative state at the period of the pulse width Tc in response to the start signal 6 output from the control circuit 7. At the same time, the analog switches 17 and 18 are turned on to connect the buffer element 5 parallel to the buffer element 2 of the main oscillation circuit 1. As a result, the buffer element 2 of the main oscillation circuit 1 and the buffer element 5 of the auxiliary oscillation circuit 4 supply an exciting current, which flows through the crystal resonator 3. In this case, the exciting current of the crystal resonator 3 is larger than one supplied from only the main oscillation circuit 1. Therefore, the crystal oscillation circuit easily starts oscillating even with the crystal resonator 3 having a high impedance.

In addition, the pulse width Tc of the start signal 6 is set in advance larger than the time Ts in which the oscillation signal 9 has a stable amplitude value ($V_1$), as shown in FIG. 2C. With this setting, the start signal 6 output from the control circuit 7 changes to "L" at time $t_1$ at which the oscillation operation becomes stable (FIG. 2B). When the start signal 6 becomes "L", the analog switches 17 and 18 are turned off, and the buffer element 5 stops its operation. The crystal oscillation circuit shown in FIG. 1 is kept oscillating by only the buffer element 2 of the main oscillation circuit 1. In this manner, since the exciting current can be decreased in a stable oscillation operation though it increases only at the start of oscillation, the current consumption of the crystal oscillation circuit shown in FIG. 1 can be reduced. When the oscillation control signal 8 changes from "H" to "L" at time $t_2$, the main oscillation circuit 1 stops its oscillation operation.

Figure 3:
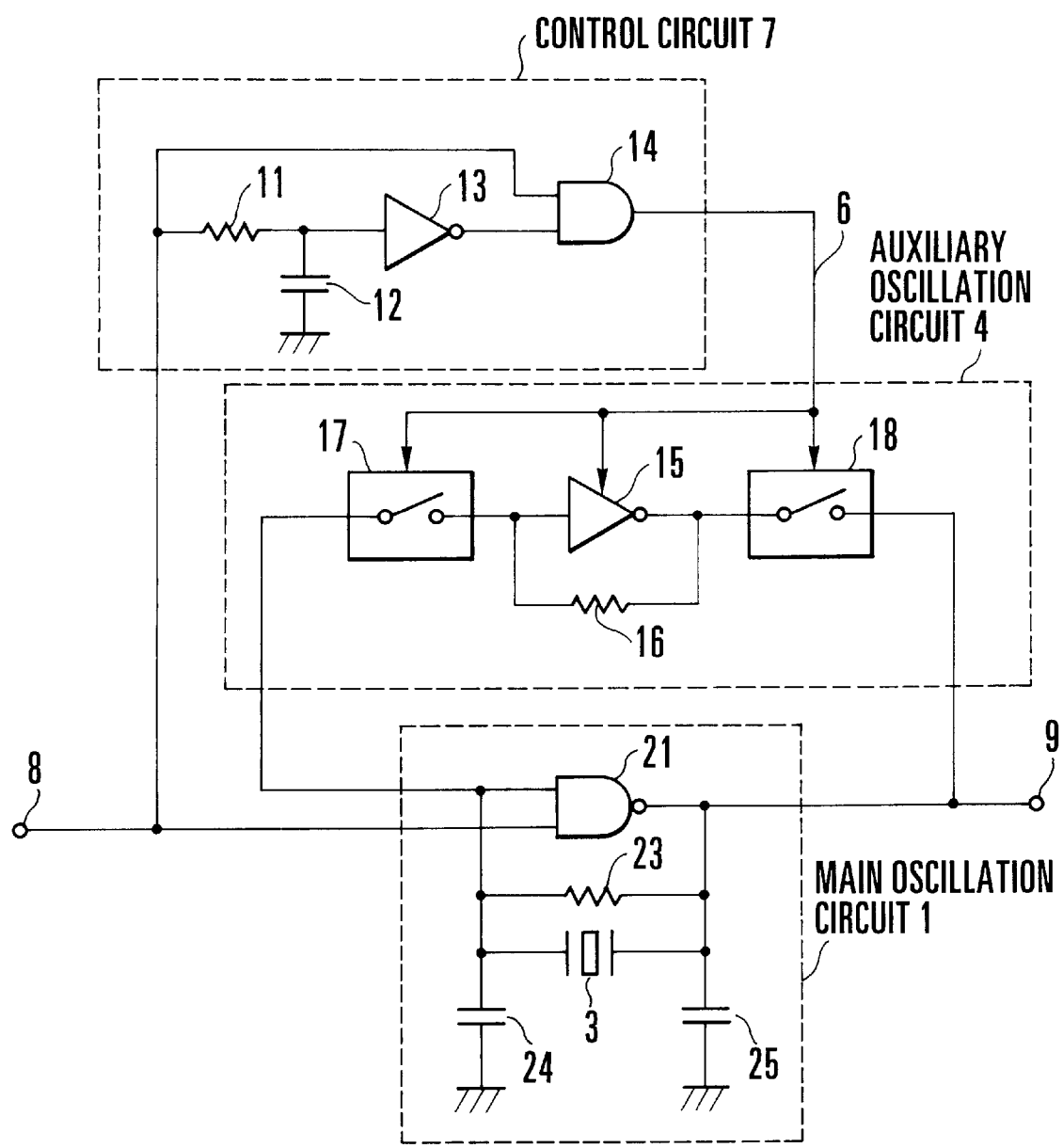
FIG. 3 is a circuit diagram showing an example of the detailed configuration of the crystal oscillation circuit shown in FIG. 1.

FIG. 3 shows an example of the detailed configuration of the crystal oscillation circuit shown in FIG. 1. The same reference numerals and symbols denote the same constituent elements as in FIG. 1, and a description thereof will be omitted.

In the control circuit 7 of FIG. 3, the oscillation control signal 8 is time-delayed by an integrating circuit constituted by a resistor 11 and a capacitor 12. The polarity of the time-delayed signal is inverted by an inverter 13, and the resultant signal is input to an AND element 14. The AND element 14 ANDs the polarity-inverted signal from the inverter 13 and the oscillation control signal 8 to output the start signal 6 having the pulse width Tc. After the control circuit 7 outputs the start signal 6, an inverter 15 of the auxiliary oscillation circuit 4 is set in an operative state, and the analog switches 17 and 18 are turned on. A resistor 16 is a feedback resistor of the inverter 15.

The time Tc shown in FIG. 2B is set to establish Tc>Ts by properly selecting the values of the resistor 11 and the capacitor 12. When the start signal 6 having a pulse width corresponding to the time Tc is disabled the analog switches 17 and 18 are turned off, and the inverter 15 stops its operation. The crystal oscillation circuit shown in FIG. 3 is kept oscillating by only a NAND element 21 of the main oscillation circuit 1.

The main oscillation circuit 1 is constituted by capacitors 24 and 25 through which the two terminals of the crystal resonator 3 are grounded, a resistor 23 connected parallel to NAND element 21 between the first input terminal and output terminal, and the exciting current drive NAND element 21 having the first input terminal and an output terminal respectively connected to the two terminals of the crystal resonator 3, and the second input terminal which receives the oscillation control signal 8. The main oscillation circuit 1 is ON/OFF-controlled by the oscillation control signal 8 input to the second input terminal of the NAND element 21. In the above embodiment, the control circuit 7 which outputs the start signal 6 is not limited to the above-described circuit. For example, a monostable multivibrator circuit may be used.

Figure 4:
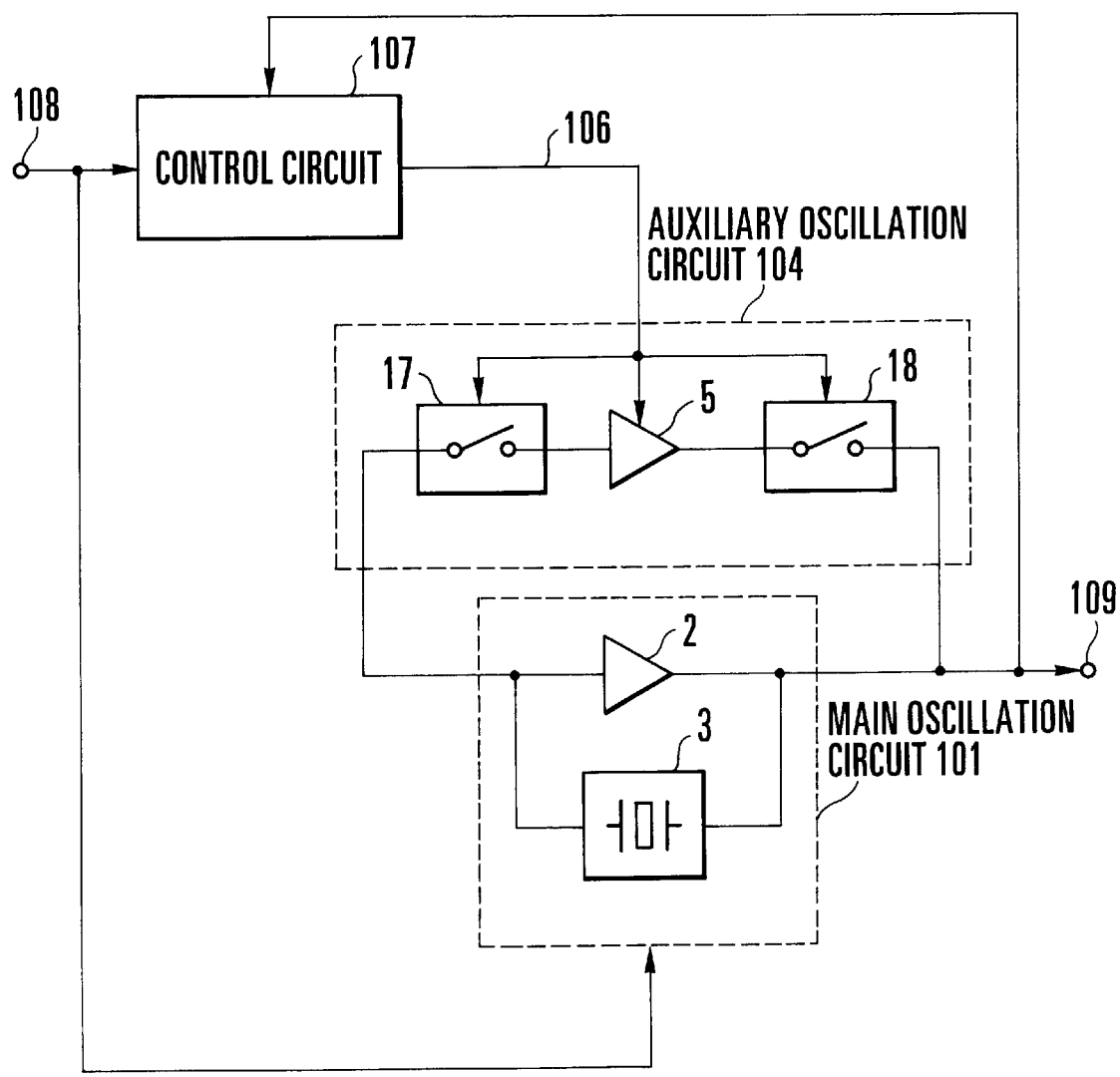
FIG. 4 is a block diagram showing a crystal oscillation circuit according to the second embodiment of the present invention.

FIG. 4 shows a crystal oscillation circuit according to the second embodiment of the present invention. The same reference numerals and symbols denote the same constituent elements as in FIG. 1, and a description thereof will be omitted.

In the crystal oscillation circuit of this embodiment, an oscillation output 109 is fed back to a control circuit 107, and a buffer element 5 and analog switches 17 and 18 of an auxiliary oscillation circuit 104 are more finely controlled on the basis of the amplitude value of the oscillation output 109. That is, the control circuit 107 stops the supply of a start signal 106 on the basis of the oscillation output 109 fed back to disconnect the auxiliary oscillation circuit 104 from a main oscillation circuit 101. Reference numeral 108 denotes an oscillation control signal.

Figure 5:
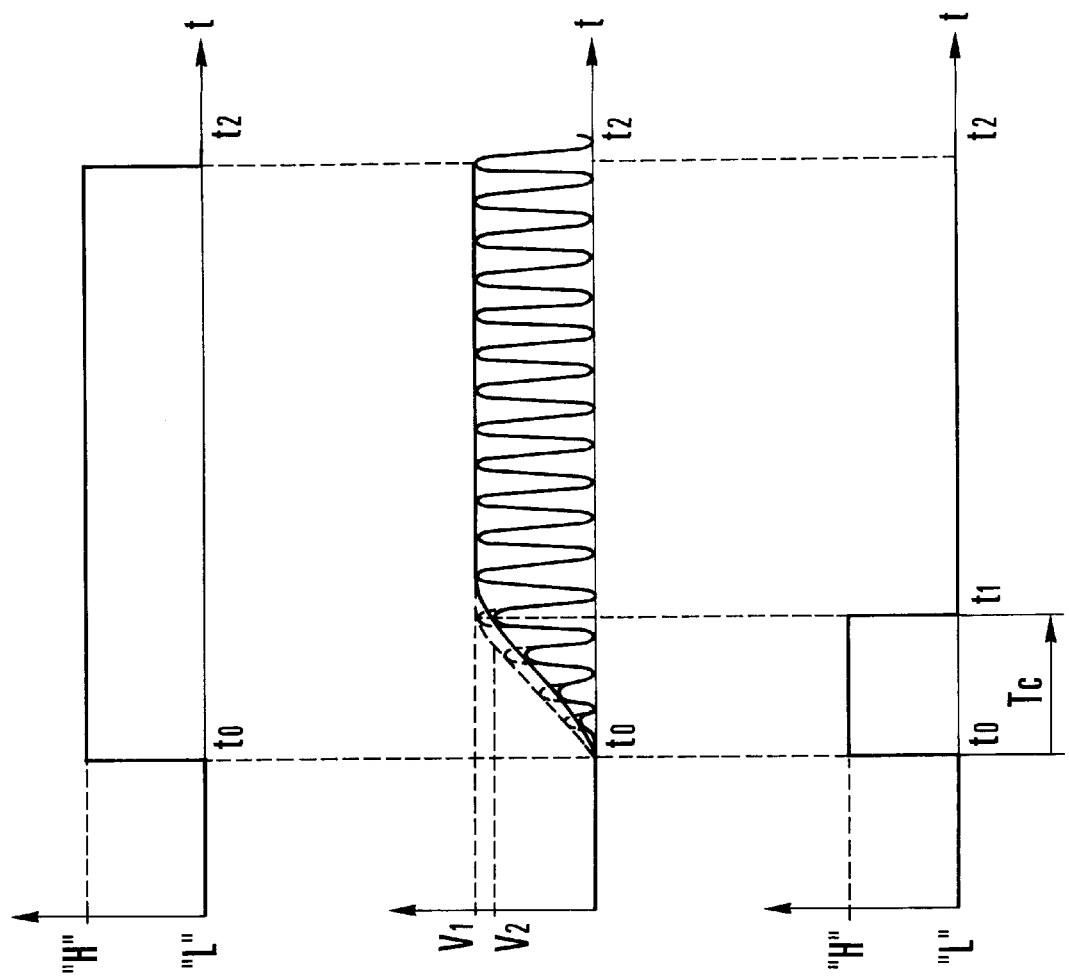
FIGS. 5A to 5C are timing charts showing an operation in the second embodiment shown in FIG. 4.

The operation of the oscillation circuit shown in FIG. 4 will be explained with reference to timing charts shown in FIGS. 5A to 5C. As shown in FIG. 5A, when oscillation is started in accordance with the leading of the oscillation control signal 108 at time $t_0$, no feedback control is performed with respect to the control circuit 107 because the voltage level of the oscillation output 109 shown in FIG. 5B is 0. Therefore, the buffer element 5 is held in an operative state by the start signal 106 output from the control circuit 107, the analog switches 17 and 18 are kept on, and the auxiliary oscillation circuit 104 maintains a state of parallel connection to the main oscillation circuit 101. In this case, since the exciting current to the crystal resonator 3 is large, similar to the case in FIG. 1, the crystal oscillation circuit can oscillate even with a crystal resonator having a high impedance.

When the oscillation output 109 has an amplitude value ($V_2$) in a metastable state at time t1, as shown in FIG. 5B, feedback control with the oscillation output 109 starts. More specifically, when the oscillation output 109 has the amplitude value ($V_2$) in the metastable state, the start signal 106 of the control circuit 107 is controlled to "L" to turn off the analog switches 17 and 18 and stop the operation of the buffer element 5, as shown in FIG. 5C. Accordingly, the crystal resonator 3 is kept oscillating by only the buffer element 2 of the main oscillation circuit 101. Note that the amplitude value $V_2$ of the oscillation output 109 is slightly lower than the amplitude value $V_1$ in a stable oscillation state, but has a level at which oscillation can be sufficiently started and the oscillation output 109 can immediately settle in the stable state if the amplitude value of the oscillation output 109 reaches the amplitude value $V_2$.

Figure 6:
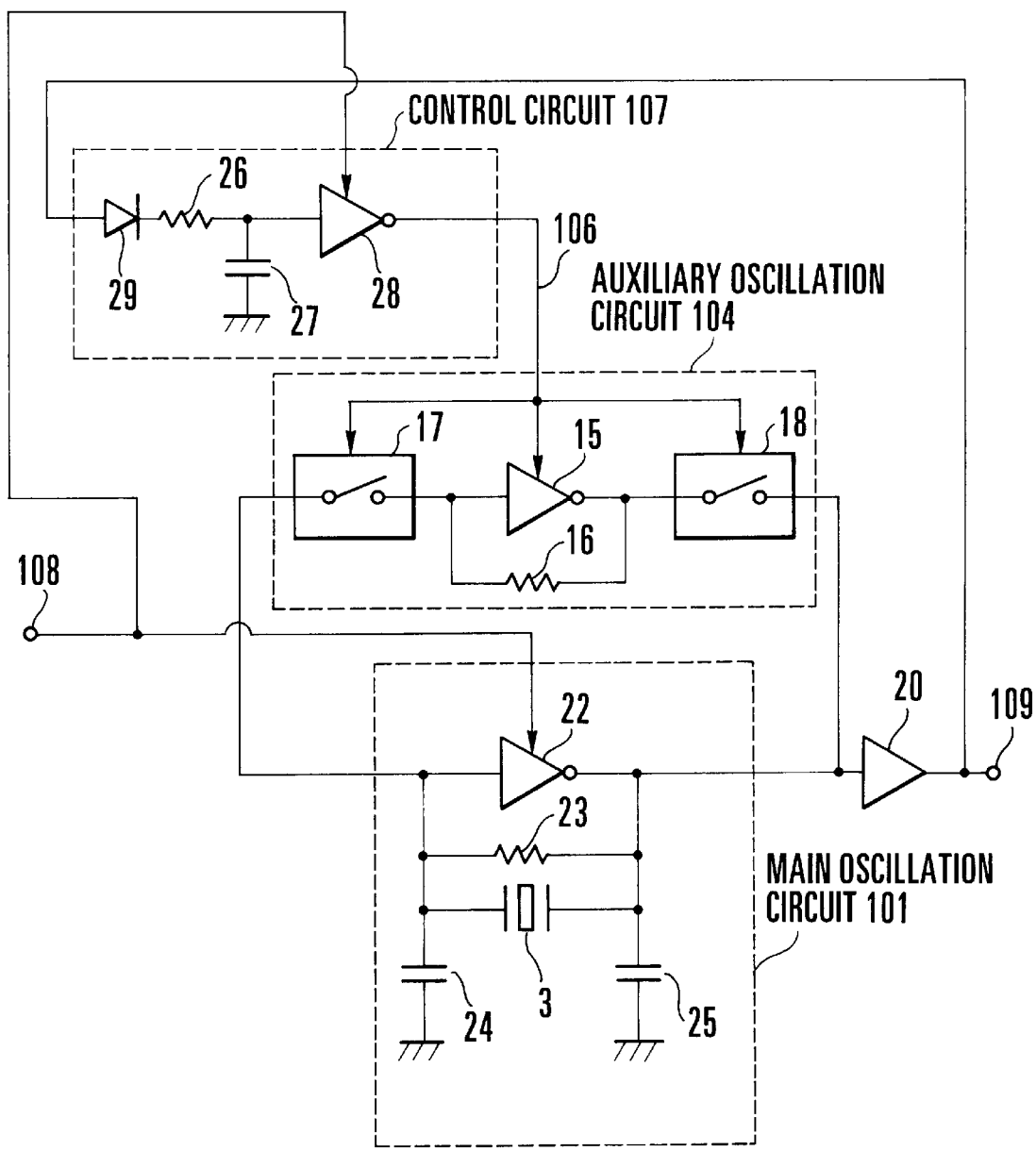
FIG. 6 is a circuit diagram showing an example of the detailed configuration of the crystal oscillation circuit shown in FIG. 4.
Figure 7:
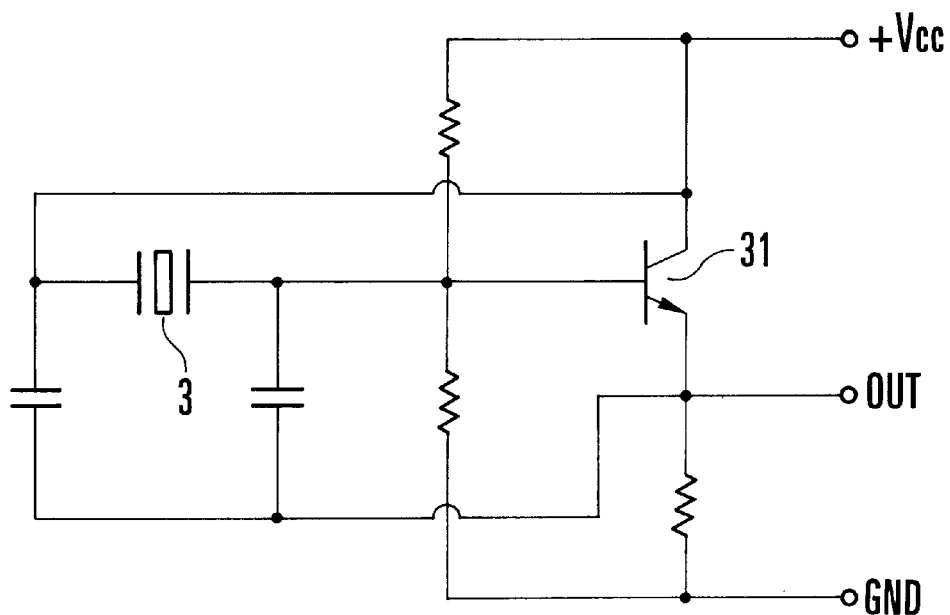
FIG. 7 is a circuit diagram showing a conventional crystal oscillation circuit using a transistor.
Figure 8:
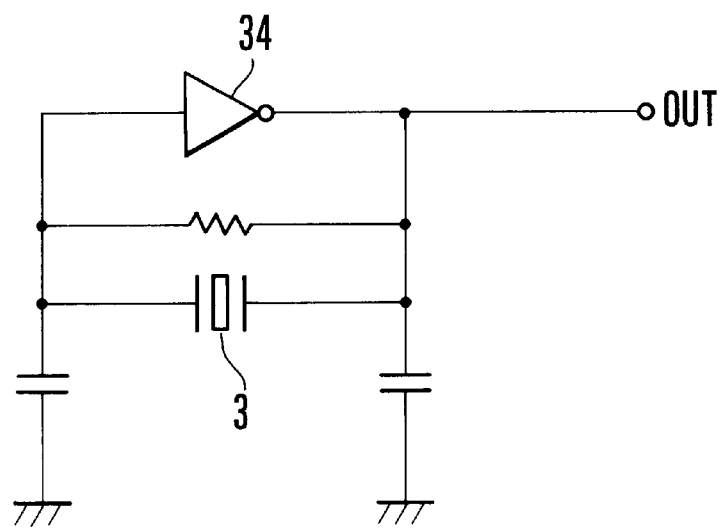
FIG. 8 is a circuit diagram showing a conventional crystal oscillation circuit using a gate element.
Figure 9:
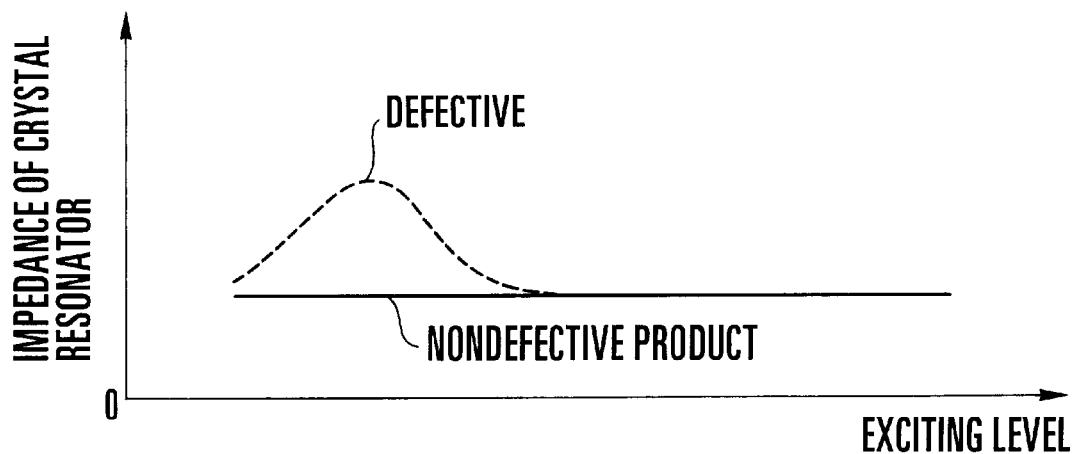
FIG. 9 is a graph showing the impedance characteristics of a crystal resonator.
Figure 10:
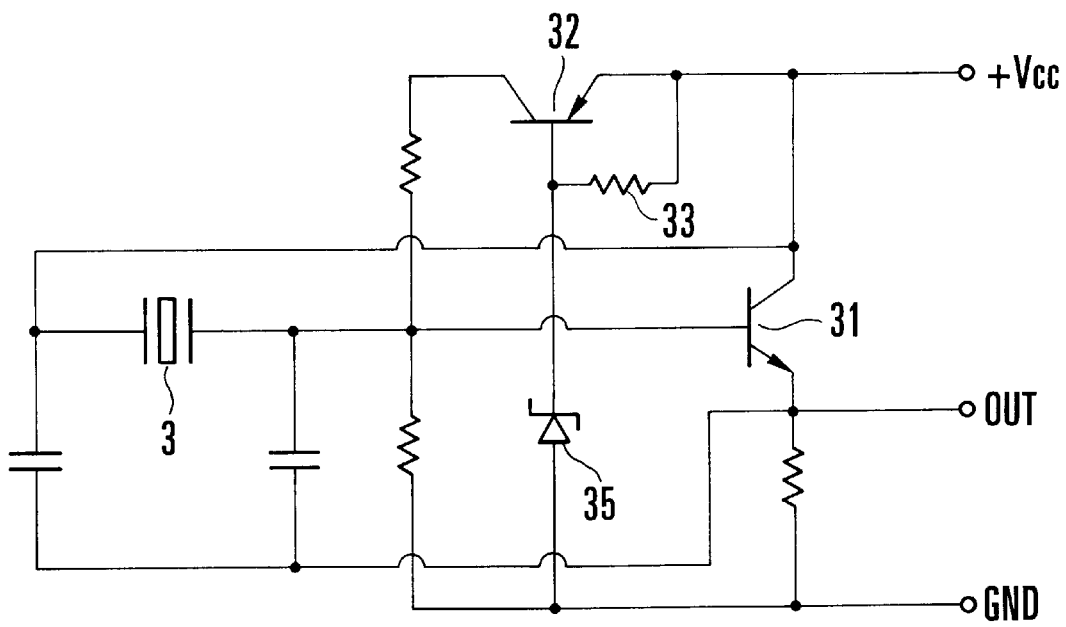
FIG. 10 is a circuit diagram showing a conventional crystal oscillation circuit which starts with a crystal resonator having a high impedance at a low exciting level.

FIG. 6 shows an example of the detailed configuration of the crystal oscillation circuit shown in FIG. 4. The same reference numerals and symbols denote the same constituent elements as in FIG. 3, and a description thereof will be omitted.

The oscillation output 109 fed back to the control circuit 107 is rectified by a diode 29. After the rectified output is integrated by an integrating circuit constituted by a resistor 26 and a capacitor 27, its polarity is inverted by an inverter 28. The inverter 28 continuously outputs the start signal 106 of "H" level during the time Tc until the amplitude value of the oscillation output 109 reaches $V_2$. With this operation, an inverter 15 is held in an operative state, and the analog switches 17 and 18 are kept on. The oscillation output 109 rectified by the diode 29 is charged by the capacitor 27 of the integrating circuit to gradually increase the input voltage of the inverter 28. When the amplitude value of the oscillation output 109 reaches $V_2$, and the charged voltage of the capacitor 27 exceeds the threshold voltage of the inverter 28, the level of the start signal 106 is inverted from "H" to "L" to turn off the analog switches 17 and 18 and stop the operation of the inverter 15. Accordingly, the auxiliary oscillation circuit 104 stops its operation, and the crystal oscillation circuit shown in FIG. 6 is kept oscillating by only an inverter 22 of the main oscillation circuit 101.

The main oscillation circuit 101 in FIG. 6 is different from the main oscillation circuit 1 in FIG. 3 in that the inverter 22 replaces the NAND element 21 of the main oscillation circuit 1, and their operations are substantially the same. In the main oscillation circuit 1 using the NAND element 21, the oscillation control signal 8 is input to the second input terminal of the NAND element 21 to control the operative state of the main oscillation circuit 1. On the other hand, in the main oscillation circuit 101 using the inverter 22, the oscillation control signal 108 directly performs ON/OFF control of the power supply of the inverter 22. That is, if no oscillation control signal 108 is input, the main oscillation circuit 101 or the control circuit 107 stops its operation. A buffer element 20 shown in FIG. 6 buffers and amplifies an oscillation output from the main oscillation circuit 101 to feed back the amplified signal to the control circuit 107. The delay time Tc is set by the values of the resistor 26 and the capacitor 27.

As has been described above, by controlling the operation of an auxiliary oscillation circuit connected to a main oscillation circuit, the crystal oscillation circuit of the present invention can start oscillating even with a crystal resonator having a high impedance at a low exciting level. In addition, since oscillation can be maintained by only the main oscillation circuit in a stable oscillation operation, the power consumption of the crystal oscillation circuit is effectively reduced.

Since the crystal oscillation circuit is constituted using an inverter and a gate element such as a NAND gate, it can be used in a logic circuit constituted by a logic IC or built in a gate array. As a result, a simple circuit configuration and an economical advantage can be attained.

What is claimed is:

1. A crystal oscillation circuit comprising:

main oscillation means having a crystal resonator which main oscillation means is controlled by a main oscillation control signal and generates a main oscillator output signal;

auxiliary oscillation means for increasing an exciting current of said crystal resonator to assist a start of oscillation of said main oscillation means when enabled by a start signal, said auxiliary oscillation means comprising a first switch element, an amplifying element and a second switch element within a series circuit; and control means for generating said start signal to temporarily couple said auxiliary oscillation means in parallel with said main oscillation means at the time said main oscillation means is enabled in order to increase said exciting current of said crystal resonator for a predetermined duration of time defined by said start signal and corresponding to the crystal resonator high-impedance state, wherein said control means comprises a monostable multivibrator circuit which is triggered by said main oscillation control signal to output said start signal to said auxiliary oscillation means until the oscillation becomes stable so said auxiliary oscillation means provides a current to the main oscillation means having a predetermined time width.

2. A crystal oscillation circuit comprising:

main oscillation means having a crystal resonator, which main oscillation means is controlled by a main oscillation control signal to generate a main oscillator signal;

auxiliary oscillation means for increasing an exciting current of said crystal resonator to assist a start of oscillation of said main oscillation means when enabled by a start signal, said auxiliary oscillation means comprising a first switch element, an amplifying element and a second switch element arranged in series; and control means for providing said start signal until the oscillation operation becomes stable to temporarily couple said auxiliary oscillation means in parallel with said main oscillation means at the time said main oscillation means is enabled in order to increase an exciting current of said crystal resonator for a predetermined duration of time corresponding to a crystal resonator high-impedance state, wherein said control means comprises an integrating circuit for integrating said main oscillation control signal representing an oscillation request for generating a delayed oscillation control signal, and an AND circuit for ANDing the main oscillation control signal and said delayed oscillation control signal, which ANDed signals generate and output the start signal.

3. A circuit according to claim 2, wherein said control means outputs the start signal only at a time said main oscillation means is enabled, and stops output of the start signal when the main oscillator output signal is output from said main oscillation means reaches a predetermined level, and, therefore said auxiliary oscillation means is connected to said main oscillation means only while said control means outputs the start signal.

4. A circuit according to claim 3, wherein said control means further comprises:

a rectifying circuit for rectifying a portion of the main oscillator output signal output from said main oscillation means to generate a rectified signal, an integrating circuit for integrating said rectified signal to generate an integrated signal, and a level determination circuit for outputting the start signal when the integrated output signal from said integrating circuit reaches a predetermined level.

5. A circuit according to claim 4, wherein at least one of said main oscillation means and said control means is enabled by said oscillation control signal.

6. A circuit according to claim 1, wherein said main oscillation means comprises an amplifying element for feeding back and amplifying the output from said crystal resonator, a resistor connected in parallel to said amplifying element, and a pair of capacitors for grounding two terminals of said crystal resonator, wherein said auxiliary oscillation means being connected parallel to said main oscillation means.

7. A circuit according to claim 6, wherein said amplifying element is constituted by a NAND circuit which has a first input terminal connected to one terminal of said crystal resonator, a second input terminal for inputting an oscillation control signal, and an output terminal connected to the other terminal of said crystal resonator.

8. A circuit according to claim 6, wherein said amplifying element is constituted by an inverter which is connected parallel to said crystal resonator.

9. A circuit according to claim 1, wherein said control means outputs the start signal in correlation with the presence of said oscillator control signal, and stops output of the start signal when said main oscillator output signal output from said main oscillation means reaches a predetermined level, and said auxiliary oscillation means being connected to said main oscillation means only while said control means outputs the start signal.

10. A circuit according to claim 9, wherein said control means comprises:

a rectifying circuit for rectifying the main oscillator output signal output from said main oscillation means to generate a rectified signal, an integrating circuit for integrating said rectified output signal to generate an integrated output signal, and a level determination circuit for outputting the start signal when the integrated output signal from said integrating circuit reaches a predetermined level.

11. A circuit according to claim 10, wherein at least one of said main oscillation means and said control means is enabled by said oscillation control signal.

12. A circuit according to claim 1, wherein said main oscillation means comprises an amplifying element for feeding back and amplifying the oscillator output signal from said crystal resonator, a resistor connected in parallel to said amplifying element, and a pair of capacitors for grounding two terminals of said crystal resonator, and wherein said auxiliary oscillation means is connected in parallel to said crystal resonator.

13. A circuit according to claim 12, wherein said amplifying element is constituted by a NAND circuit which has a first input terminal connected to one of the terminals of said crystal resonator, a second input terminal for inputting said oscillation control signal, and an output terminal connected to the other terminal of said crystal resonator.

14. A circuit according to claim 12, wherein said amplifying element further comprises an inverter which is connected in parallel to said crystal resonator.

15. A crystal oscillation circuit comprising:

a main oscillation circuit for oscillating by inputting an oscillation control signal representing an oscillation request;

a control circuit for receiving the oscillation control signal and generating a start signal having a predetermined pulse width, which is triggered by said oscillation control signal; and an auxiliary oscillation circuit connected to said control circuit and connected in parallel to said main oscillation circuit, said auxiliary oscillation circuit comprising a series circuit of a first switch element, an amplifying element and a second switch element;

wherein said amplifying element of said auxiliary oscillation circuit is connected to said main oscillation circuit in parallel for a predetermined time in accordance with an ON/OFF operation of said first and second switch elements in response to said start signal.

16. A crystal oscillation circuit comprising:

a main oscillation circuit for oscillating by an oscillation control signal representing an oscillation request;

a control circuit for receiving the oscillation control signal and generating a start signal having a predetermined pulse width, which control circuit is triggered by said oscillation control signal; and an auxiliary oscillation circuit connected to said main oscillation circuit in parallel, said auxiliary oscillation circuit comprising a series circuit of a first switch element, and amplifying element and a second switch element, said first and second switch elements being closed by the start signal from said control circuit;

wherein said control circuit generates and outputs the start signal to said auxiliary circuit based on a time the control circuit is receiving a feedback of oscillating output from said main oscillation circuit so that said amplifying element of said auxiliary oscillation circuit is connected to said main oscillation circuit until the oscillation output from said main oscillation circuit reaches a predetermined level.

* * * * *

UNITED STATES PATENT AND TRADEMARK OFFICE
CERTIFICATE OF CORRECTION

PATENT NO. : 6,133,801
DATED : October 17, 2000
INVENTOR(S) : Shoichi Tnaka

It is certified that error appears in the above-identified patent and that said Letters Patent is hereby corrected as shown below:

Column 2,
Line 63, "feedback amplification buffer element 5" should read -- buffer element 5 for increasing an exciting current of the crystal resonator 3 --
Line 67, "circuit" should read -- operation --

Column 7,
Lines 5 and 6, "connected parallel" should read -- connected in parallel --
Lines 14 and 15, "connected parallel" should read -- connected in parallel --

Signed and Sealed this

Sixth Day of August, 2002

*Attest:*

JAMES E. ROGAN
*Attesting Officer*        Director of the United States Patent and Trademark Office